US012320735B2

(12) United States Patent
Goh et al.

(10) Patent No.: US 12,320,735 B2
(45) Date of Patent: Jun. 3, 2025

(54) BUBBLE MEASUREMENT UNIT, SUBSTRATE TREATING APPARATUS INCLUDING THE SAME, AND BUBBLE MEASUREMENT METHOD

(71) Applicants: SEMES CO., LTD., Cheonan-si (KR); SEOUL NATIONAL UNIVERSITY R&DB FOUNDATION, Seoul (KR)

(72) Inventors: Jung Suk Goh, Hwaseong-si (KR); A Rah Cho, Daejeon (KR); Hyungmin Park, Seoul (KR); Linfeng Piao, Incheon (KR); Jubeom Lee, Gimpo-si (KR); Jungjin Lee, Seoul (KR)

(73) Assignees: SEMES CO., LTD., Cheonan-si (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 272 days.

(21) Appl. No.: 17/902,094

(22) Filed: Sep. 2, 2022

(65) Prior Publication Data
US 2023/0073468 A1   Mar. 9, 2023

(30) Foreign Application Priority Data
Sep. 3, 2021   (KR) .................. 10-2021-0117424

(51) Int. Cl.
*G01N 15/00*   (2024.01)
*G01N 15/14*   (2024.01)
(Continued)

(52) U.S. Cl.
CPC .......... *G01N 15/00* (2013.01); *G01N 15/147* (2013.01); *G03F 7/162* (2013.01);
(Continued)

(58) Field of Classification Search
CPC ................ G01N 15/00; G01N 15/147; G01N 2015/0011; G01N 2015/1486;
(Continued)

(56) References Cited

U.S. PATENT DOCUMENTS 7,517,469 B2 * 4/2009 Herchen ........... H01L 21/67225
                                                       700/282
2002/0176928 A1 * 11/2002 Minami ............ H01L 21/67253
                                                       427/8
(Continued)

FOREIGN PATENT DOCUMENTS

JP     2004-530473 A     10/2004
JP     2005-136186 A      5/2005
(Continued)

OTHER PUBLICATIONS

English Machine translation of WO 2016/084927 A1 (Year: 2016).*
Japanese Office Action dated Jul. 25, 2023 issued in corresponding Japanese Patent Application No. 2022-131515.

*Primary Examiner* — Dominic J Bologna
(74) *Attorney, Agent, or Firm* — Harness, Dickey & Pierce, P.L.C.

(57) ABSTRACT

The inventive concept relates to an apparatus for treating a substrate. The apparatus includes a liquid supply unit that supplies a liquid to a substrate, a cover that is formed of a light transmitting material and installed on a component provided in the liquid supply unit and that provides an inspection area, and an inspection unit that inspects bubbles contained in the liquid flowing in the component provided in the inspection area. The inspection unit includes a light source that applies light toward the inspection area from outside the cover, a light receiving part that is located outside the cover and that receives the light passing through
(Continued)

the inspection area, and an inspection part that inspects the bubbles from the light received by the light receiving part.

18 Claims, 10 Drawing Sheets

(51) Int. Cl.
*G03F 7/16* (2006.01)
*H01L 21/67* (2006.01)

(52) U.S. Cl.
CPC .... *H01L 21/67017* (2013.01); *H01L 21/6715* (2013.01); *H01L 21/67178* (2013.01); *H01L 21/67253* (2013.01); *G01N 2015/0011* (2013.01); *G01N 2015/1486* (2013.01); *G01N 2015/1493* (2013.01)

(58) Field of Classification Search
CPC ............ G01N 2015/1493; G03F 7/162; H01L 21/67017; H01L 21/6715; H01L 21/67178; H01L 21/67253
See application file for complete search history.

(56) References Cited

U.S. PATENT DOCUMENTS

| | | | | |
|---|---|---|---|---|
| 2004/0001618 | A1* | 1/2004 | Johnson | G06T 11/006 382/131 |
| 2007/0251921 | A1* | 11/2007 | Herchen | G01F 1/7086 216/84 |
| 2010/0322494 | A1* | 12/2010 | Fauver | G01N 15/1433 382/131 |
| 2017/0309012 | A1* | 10/2017 | Mabe | G02B 5/005 |

FOREIGN PATENT DOCUMENTS

| | | | |
|---|---|---|---|
| JP | 2006-509197 A | 3/2006 | |
| JP | 2006-310587 A | 11/2006 | |
| JP | 2006-313822 A | 11/2006 | |
| JP | 2007-17207 A | 1/2007 | |
| JP | 2008-083061 A | 4/2008 | |
| JP | 2011-503516 A | 1/2011 | |
| WO | WO-2016084927 A1 * | 6/2016 | ............ B05C 11/00 |

* cited by examiner

BUBBLE MEASUREMENT UNIT, SUBSTRATE TREATING APPARATUS INCLUDING THE SAME, AND BUBBLE MEASUREMENT METHOD

CROSS-REFERENCE TO RELATED APPLICATIONS

A claim for priority under 35 U.S.C. § 119 is made to Korean Patent Application No. 10-2021-0117424 filed on Sep. 3, 2021, in the Korean Intellectual Property Office, the entire contents of which are hereby incorporated by reference.

BACKGROUND

Embodiments of the inventive concept described herein relate to a bubble measurement unit, a substrate treating apparatus including the same, and a bubble measurement method, and more particularly, relate to a bubble measurement unit for measuring bubbles contained in a flowing liquid, a substrate treating apparatus including the bubble measurement unit, and a bubble measurement method.

Various processes, such as cleaning, deposition, photolithography, etching, and ion implantation, are performed to manufacture semiconductor devices. Among these processes, the photolithography process includes a coating process of coating a surface of a substrate with a photosensitive liquid, such as photoresist, to form a film, an exposure process of transferring a circuit pattern to the film formed on the substrate, and a developing process of selectively removing the film formed on the substrate from an exposed region or an unexposed region.

In the various processes, such as cleaning, deposition, photolithography, etching, and ion implantation, bubbles may be formed in a liquid flowing in components constituting a liquid supply apparatus. When the liquid containing the bubbles is supplied onto a substrate, the uniformity of the thickness of the liquid formed on the substrate is deteriorated. This causes a problem in that the yield of the substrate is decreased.

Accordingly, the number and sizes of bubbles flowing in the components have to be detected, and the bubbles have to be removed from the liquid flowing in the components. To this end, the number and sizes of bubbles contained in the liquid flowing in the components have to be accurately measured. Each of the components constituting the liquid supply apparatus may have a curved cross-section perpendicular to the lengthwise direction thereof. When the component has a curved cross-section, light applied toward the boundary of the component may be reflected or refracted. Due to the reflection or refraction of the light, the shapes of the bubbles flowing in the component may be distorted. Therefore, it is difficult to detect the bubbles contained in the liquid flowing in the component by applying the light toward the component. This hinders accurate measurement of the number and sizes of bubbles flowing in the component. This problem is further exacerbated when the bubbles flowing in the component have an extremely small size of 10 micrometers or less.

SUMMARY

Embodiments of the inventive concept provide a bubble measurement unit for measuring bubbles contained in a liquid flowing in a liquid supply unit, a substrate treating apparatus including the bubble measurement unit, and a bubble measurement method.

Furthermore, embodiments of the inventive concept provide a bubble measurement unit for minimizing refraction of incident light at the boundary of a component provided in a liquid supply unit, a substrate treating apparatus including the bubble measurement unit, and a bubble measurement method.

In addition, embodiments of the inventive concept provide a bubble measurement unit for obtaining a constant bubble image irrespective of the cross-sectional shape of a component provided in a liquid supply unit, a substrate treating apparatus including the bubble measurement unit, and a bubble measurement method.

The technical problems to be solved by the inventive concept are not limited to the aforementioned problems, and any other technical problems not mentioned herein will be clearly understood from the following description by those skilled in the art to which the inventive concept pertains.

According to an embodiment, an apparatus for treating a substrate includes a liquid supply unit that supplies a liquid to a substrate, a cover that is formed of a light transmitting material and installed on a component provided in the liquid supply unit and that provides an inspection area, and an inspection unit that inspects bubbles contained in the liquid flowing in the component provided in the inspection area. The inspection unit includes a light source that applies light toward the inspection area from outside the cover, a light receiving part that is located outside the cover and that receives the light passing through the inspection area, and an inspection part that inspects the bubbles from the light received by the light receiving part.

According to an embodiment, the cover may surround the component such that a space is provided between the cover and the component, and the space may be filled with a material having the same refractive index as a material of the component provided in the inspection area.

According to an embodiment, the cover may be formed of a material having a refractive index greater than a refractive index of the material with which the space is filled.

According to an embodiment, the material with which the space is filled may be a liquid.

According to an embodiment, the component may have a curved cross-section perpendicular to a lengthwise direction thereof, a first surface of the cover that faces the light source may be flat, and the light source may apply the light in a direction perpendicular to the first surface.

According to an embodiment, a second surface of the cover that faces the first surface may be parallel to the first surface.

According to an embodiment, the inspection unit may further include a diffusion plate that is located between the light source and the first surface and that diffuses the light applied by the light source.

According to an embodiment, the liquid supply unit may include a liquid supply nozzle that dispenses the liquid onto substrate, a tank having the liquid stored therein, a pump that provides flow pressure to the liquid supplied to the liquid supply nozzle, and a liquid supply line through which the liquid is supplied from the tank to the liquid supply nozzle.

According to an embodiment, the cover may be installed on the liquid supply line.

According to an embodiment, the cover may be installed on the tank.

According to an embodiment, the cover may be installed on the liquid supply nozzle.

According to an embodiment, the cover may be installed on the pump.

According to an embodiment, a bubble measurement unit for measuring bubbles contained in a liquid flowing in a component includes a cover that is formed of a light transmitting material and installed on the component and that provides an inspection area and an inspection unit that inspects the bubbles contained in the liquid flowing in the component provided in the inspection area. The inspection unit includes a light source that applies light toward the inspection area from outside the cover, a light receiving part that is located outside the cover and that receives the light passing through the inspection area, and an inspection part that inspects the bubbles from the light received by the light receiving part.

According to an embodiment, the cover may surround the component such that a space is provided between the cover and the component, and the space may be filled with a material having the same refractive index as a material of the component provided in the inspection area.

According to an embodiment, the cover may be formed of a material having a refractive index greater than a refractive index of the material with which the space is filled.

According to an embodiment, the component may have a curved cross-section perpendicular to a lengthwise direction thereof. A first surface of the cover that faces the light source may be flat, and a second surface of the cover that faces the first surface may be parallel to the first surface. The light source may apply the light in a direction perpendicular to the first surface.

According to an embodiment, a bubble measurement method for measuring bubbles contained in a liquid stored in a component or flowing in the component is provided. In the bubble measurement method, an inspection area of the component is surrounded by a cover, light is applied toward the inspection area from outside the cover, an image of the bubbles contained in the liquid stored in the component or flowing in the component is obtained by receiving the light passing through the inspection area, and the bubbles formed in the component are inspected from the image.

According to an embodiment, a space between the cover and the component may be filled with a material having the same refractive index as a material of the component.

According to an embodiment, the cover may be formed of a material having a refractive index greater than a refractive index of the material with which the space is filled.

According to an embodiment, the component may have a curved cross-section perpendicular to a lengthwise direction thereof. A first surface of the cover that faces a light source that applies the light may be flat, and a second surface of the cover that faces the first surface may be parallel to the first surface. The light source may apply the light in a direction perpendicular to the first surface.

BRIEF DESCRIPTION OF THE FIGURES

The above and other objects and features will become apparent from the following description with reference to the following figures, wherein like reference numerals refer to like parts throughout the various figures unless otherwise specified.

DETAILED DESCRIPTION

Figure 1:
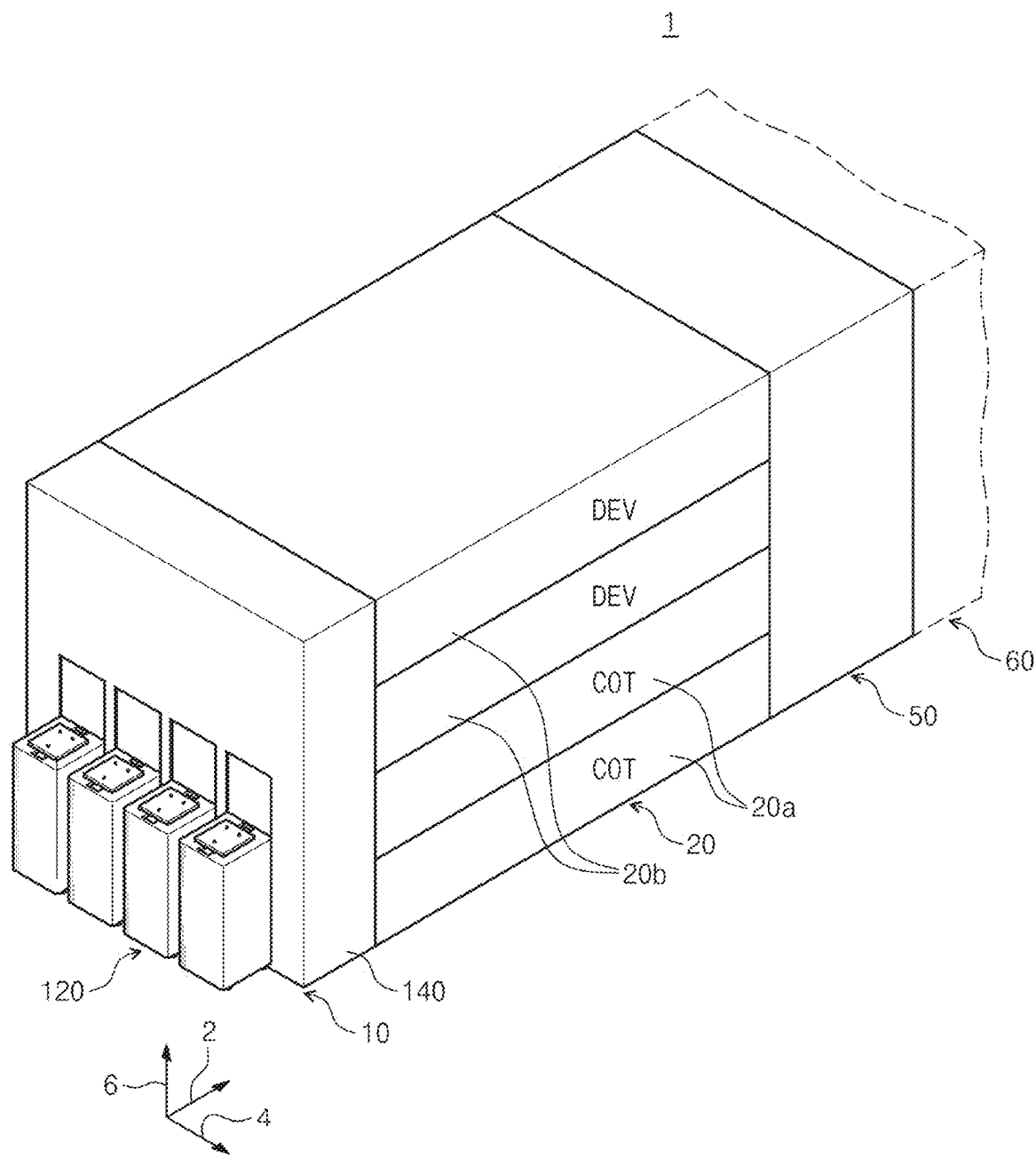
FIG. 1 is a schematic perspective view illustrating a substrate treating apparatus according to an embodiment of the inventive concept.

Hereinafter, embodiments of the inventive concept will be described in more detail with reference to the accompanying drawings. Various modifications and variations can be made to embodiments of the inventive concept, and the scope of the inventive concept should not be construed as limited to the embodiments set forth herein. These embodiments are provided so that this disclosure will be thorough and complete, and will fully convey the scope of the inventive concept to those skilled in the art. Accordingly, in the drawings, the shapes of components are exaggerated for clarity of illustration.

Hereinafter, embodiments of the inventive concept will be described in detail with reference to FIGS. 1 to 12. In the following embodiments, an apparatus for performing a process of coating a substrate with photoresist and developing the substrate after exposure will be described as an example of a substrate treating apparatus. However, without being limited thereto, the inventive concept is applicable to various types of apparatuses for treating a substrate by supplying a liquid to the rotating substrate. For example, the substrate treating apparatus may be an apparatus for performing a process of removing foreign matter on a substrate by supplying a cleaning solution to the substrate or a process of removing a thin film on a substrate by supplying a chemical solution to the substrate.

Figure 2:
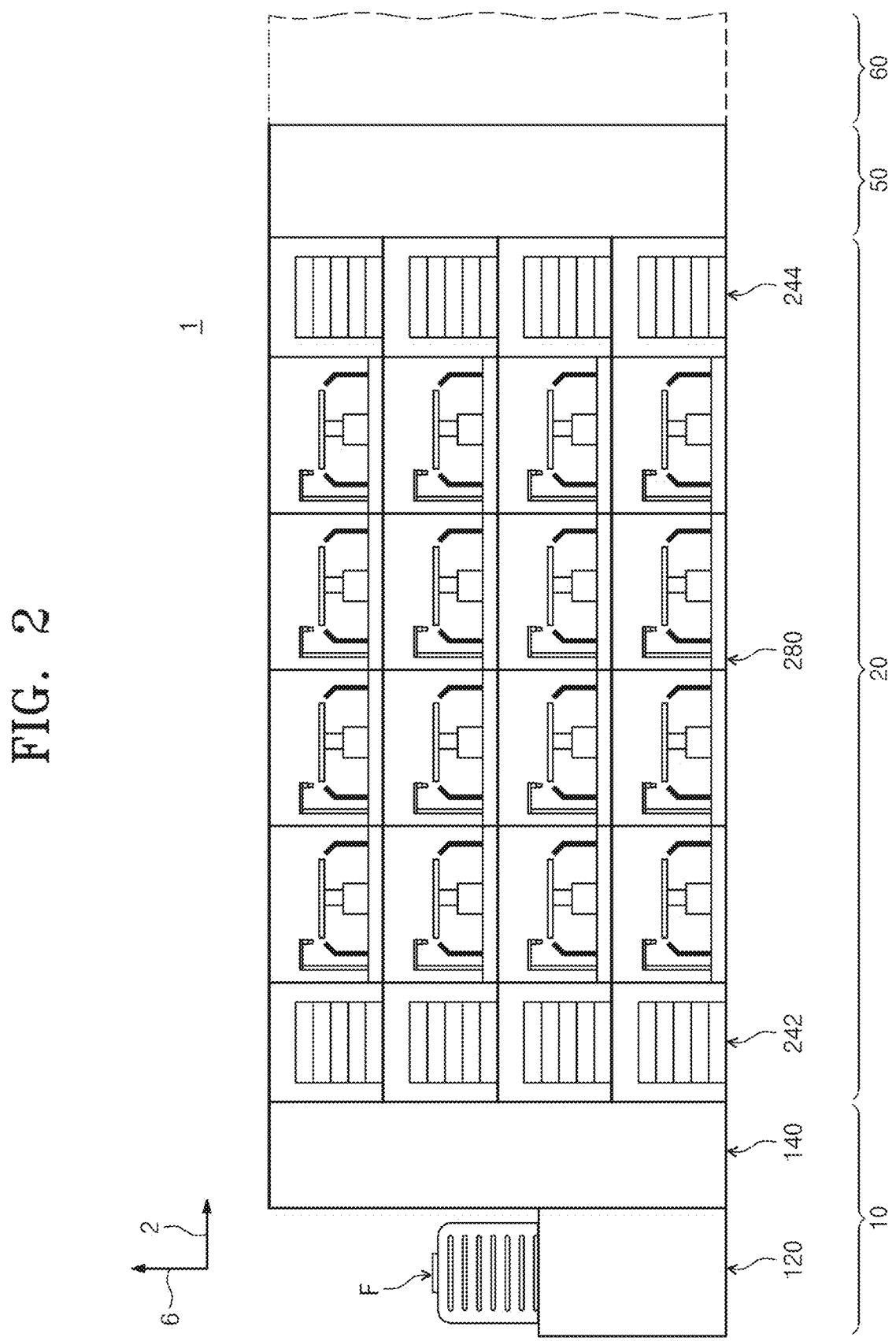
FIG. 2 is a schematic front view illustrating coating blocks and developing blocks of the substrate treating apparatus of FIG. 1.
Figure 3:
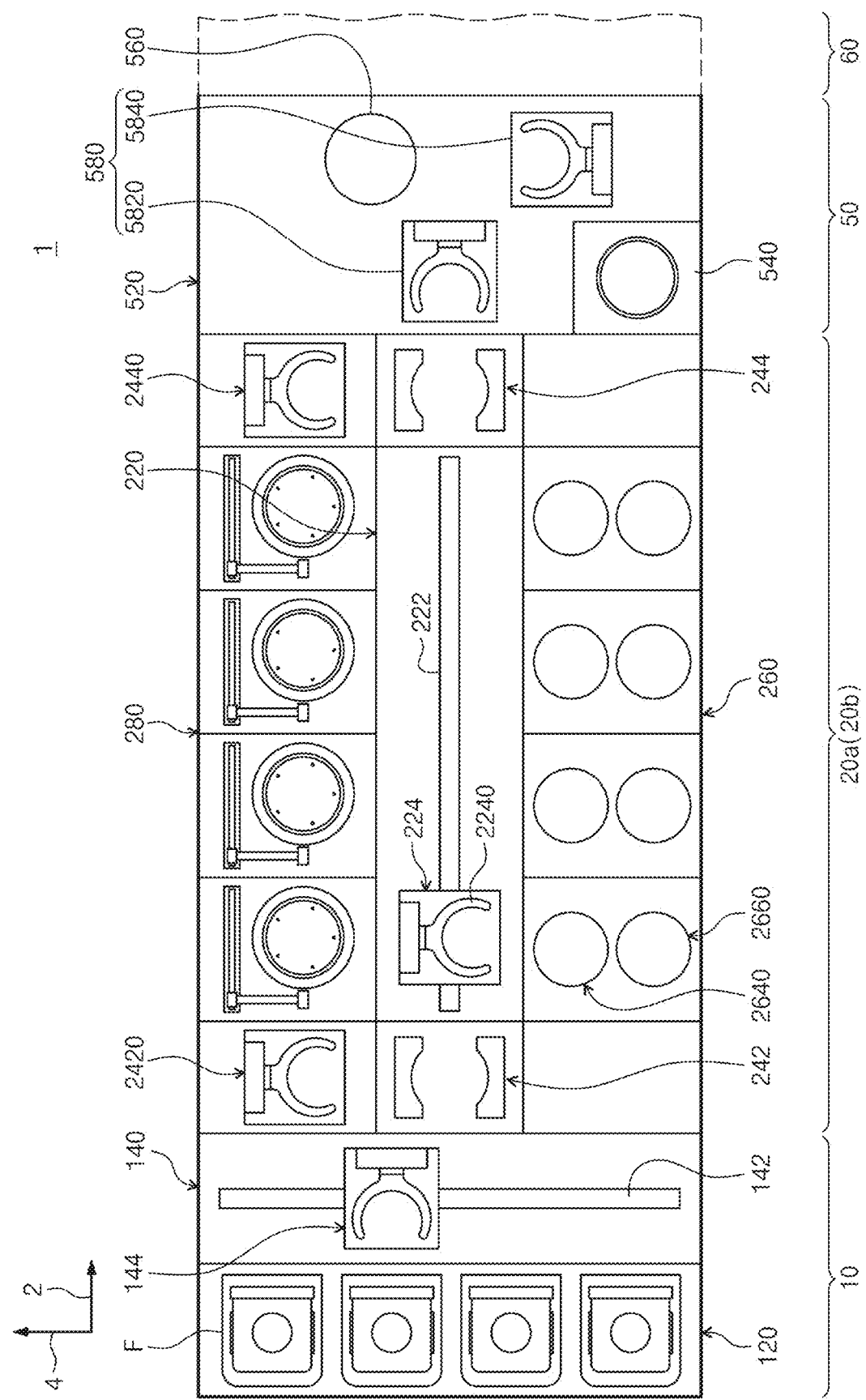
FIG. 3 is a schematic plan view illustrating the substrate treating apparatus of FIG. 1.

FIG. 1 is a schematic perspective view illustrating the substrate treating apparatus according to an embodiment of the inventive concept. FIG. 2 is a front view of the substrate treating apparatus of FIG. 1. FIG. 3 is a plan view of the substrate treating apparatus of FIG. 1.

Referring to FIGS. 1 to 3, the substrate treating apparatus 1 includes an index module 10, a treating module 20, and an interface module 50. According to an embodiment, the index module 10, the treating module 20, and the interface module 50 are sequentially arranged in a row. Hereinafter, a direction in which the index module 10, the treating module 20, and the interface module 50 are arranged is referred to as a first direction 2, a direction perpendicular to the first direction 2 when viewed from above is referred to as a second direction 4, and a direction perpendicular to a plane including both the first direction 2 and the second direction 4 is referred to as a third direction 6.

The index module 10 transfers substrates W from carriers F having the substrates W received therein to the treating module 20 that treats the substrates W. The index module 10 places, in the carriers F, the substrates W completely treated in the treating module 20. The index module 10 is disposed such that the lengthwise direction thereof is parallel to the second direction 4. The index module 10 has load ports 120 and an index frame 140.

The carriers F having the substrates W received therein are seated on the load ports 120. The load ports 120 are located on the opposite side to the treating module 20 with respect to the index frame 140. The load ports 120 may be disposed in a row in the second direction 4. The number of load ports 120 may be increased or decreased depending on the process efficiency and the footprint condition of the treating module 20.

Each of the carriers F has a plurality of slots (not illustrated) formed therein in which the substrates W are received in a state of being horizontally disposed with respect to the ground. Airtight carriers, such as front open unified pods (FOUPs), may be used as the carriers F. The carriers F may be placed on the load ports 120 by a transfer unit (not illustrated), such as an overhead transfer, an overhead conveyor, or an automatic guided vehicle, or by an operator.

An index rail 142 and an index robot 144 are provided in the index frame 140. The index rail 142 is disposed in the index frame 140 such that the lengthwise direction thereof is parallel to the second direction 4. The index robot 144 may transfer the substrates W. The index robot 144 may transfer the substrates W between the index module 10 and a buffer chamber 140 to be described below. The index robot 144 may include an index hand. The substrate W may be placed on the index hand. The configuration of the index hand is identical or similar to a configuration of a transfer hand 2240 to be described below. The index hand may be movable on the index rail 142 in the second direction 4. Accordingly, the index hand is movable forward and backward along the index rail 142. In addition, the index hand is rotatable about an axis facing in the third direction 6 and movable in the third direction 6.

The treating module 20 receives the substrates W accommodated in the carriers F and performs a coating process and a developing process on the substrates W. The treating module 20 has the coating blocks 20*a* and the developing blocks 20*b*. The coating blocks 20*a* perform the coating process on the substrates W. The developing blocks 20*b* perform the developing process on the substrates W. The coating blocks 20*a* are stacked one above another. The developing blocks 20*b* are stacked one above another. According to the embodiment of FIG. 1, two coating blocks 20*a* and two developing block 20*b* are provided. The coating blocks 20*a* may be disposed under the developing blocks 20*b*. According to an embodiment, the two coating blocks 20*a* may perform the same process and may have the same structure. Furthermore, the two developing blocks 20*b* may perform the same process and may have the same structure.

Referring to FIG. 3, each of the coating blocks 20*a* has a transfer chamber 220, the buffer chamber 140, heat treatment chambers 260, and liquid treatment chambers 280. The transfer chamber 220 provides a space for transferring the substrates W between the buffer chamber 140 and the heat treatment chambers 260, between the buffer chamber 140 and the liquid treatment chambers 280, and between the heat treatment chambers 260 and the liquid treatment chambers 280. The buffer chamber 140 provides a space in which substrates W carried into the coating block 20*a* and substrates W to be carried out of the coating block 20*a* temporarily stay. The heat treatment chambers 260 perform a heat treatment process on the substrates W. The heat treatment process may include a cooling process and a heating process. The liquid treatment chambers 280 form liquid films on the substrates W by supplying a liquid onto the substrates W. The liquid films may be photoresist films or anti-reflection films.

The transfer chamber 220 may be disposed such that the lengthwise direction thereof is parallel to the first direction 2. A guide rail 222 and a transfer robot 224 are provided in the transfer chamber 220. The guide rail 222 is disposed in the transfer chamber 220 such that the lengthwise direction thereof is parallel to the first direction 2. The transfer robot 224 may be linearly movable on the guide rail 222 in the first direction 2. The transfer robot 224 transfers the substrates W between the buffer chamber 140 and the heat treatment chambers 260, between the buffer chamber 140 and the liquid treatment chambers 280, and between the heat treatment chambers 260 and the liquid treatment chambers 280.

According to an embodiment, the transfer robot 224 has the transfer hand 2240 on which the substrate W is placed. The transfer hand 2240 is movable forward and backward, rotatable about an axis facing in the third direction 6, and movable in the third direction 6.

Figure 4:
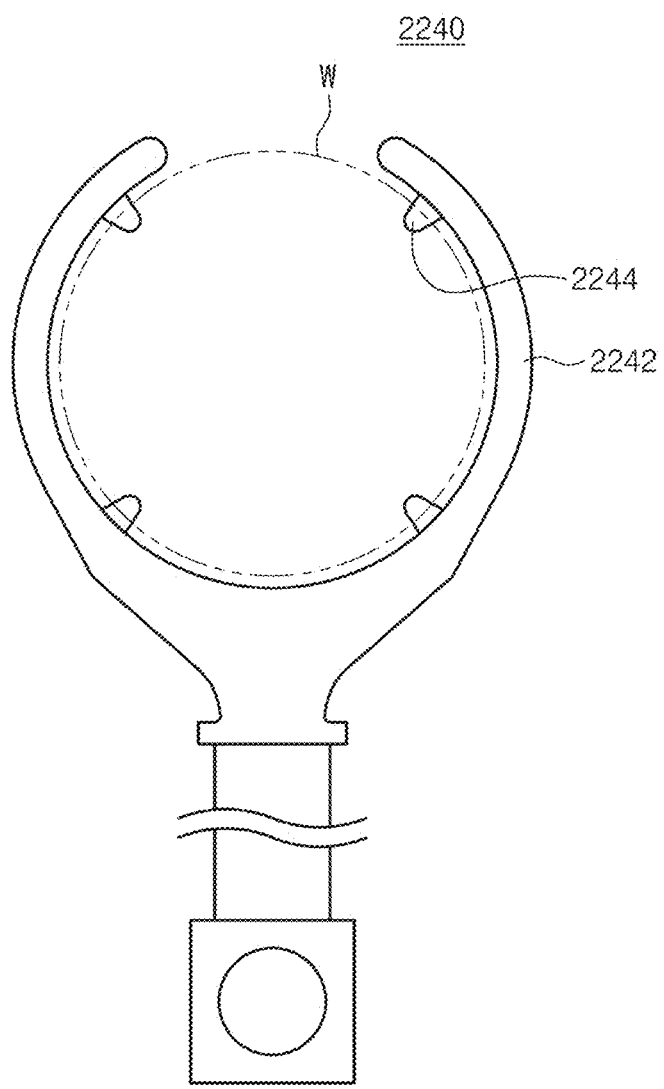
FIG. 4 is a view illustrating one example of a hand provided in a transfer chamber of FIG. 3.

FIG. 4 is a view illustrating one embodiment of the transfer hand provided in the transfer chamber of FIG. 3. Referring to FIG. 4, the transfer hand 2240 has a base 2242 and support protrusions 2244. The base 2242 may have an annular ring shape in which a portion of the circumference is curved. The base 2242 may have a ring shape in which portions of the circumference are curved so as to be symmetrical to each other. The base 2242 has an inner diameter greater than the diameter of the substrate W. The support protrusions 2244 extend inward from the base 2242. The support protrusions 2244 support an edge region of the substrate W. According to an embodiment, four support protrusions 2244 may be provided at equal intervals.

Referring again to FIGS. 2 and 3, a plurality of buffer chambers 240 are provided. Some of the buffer chambers 240 are disposed between the index module 10 and the transfer chamber 220. Hereinafter, these buffer chambers are defined as front buffers 242. The front buffers 242 are vertically stacked one above another. The other buffer chambers 240 are disposed between the transfer chamber 220 and the interface module 50. Hereinafter, these buffer chambers are defined as rear buffers 244. The rear buffers 244 are vertically stacked one above another. The front buffers 242 and the rear buffers 244 temporarily store a plurality of substrates W. The substrates W stored in the front buffers 242 are loaded or unloaded by the index robot 144 and the transfer robot 224. The substrates W stored in the rear buffers 244 are loaded or unloaded by the transfer robot 224 and a first robot 3820 to be described below.

Buffer robots (2420 and 2440) may be provided on one side of the buffer chambers 240. The buffer robots (2420 and 2440) may include the front buffer robot 2420 and the rear buffer robot 2440. The front buffer robot 2420 may be provided on one side of the front buffers 242. The rear buffer robot 2440 may be provided on one side of the rear buffers 244. Without being limited thereto, the buffer robots (2420 and 2440) may be provided on opposite sides of the buffer chambers 240.

The front buffer robot 2420 may transfer the substrates W between the front buffers 242. The front buffer robot 2420 may include a front buffer hand. The front buffer hand may be vertically moved in the third direction 6. The front buffer hand may be rotated. The front buffer hand may transfer the substrates W. The rear buffer robot 2440 may transfer the substrates W between the rear buffers 244. The rear buffer robot 2440 may include a rear buffer hand. A configuration of the rear buffer hand is identical or similar to the configuration of the front buffer hand. Therefore, description of the rear buffer hand will be omitted.

Figure 5:
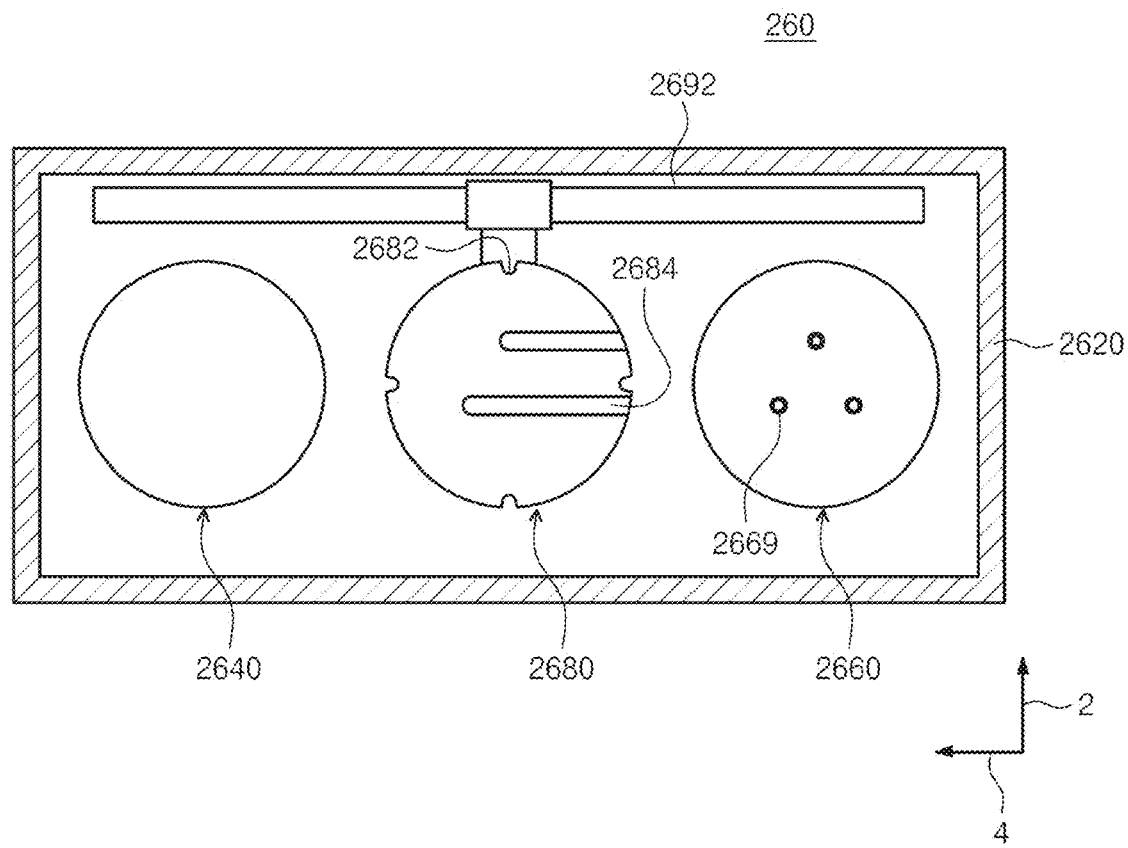
FIG. 5 is a schematic plan view illustrating one example of heat treatment chambers of FIG. 3.
Figure 6:
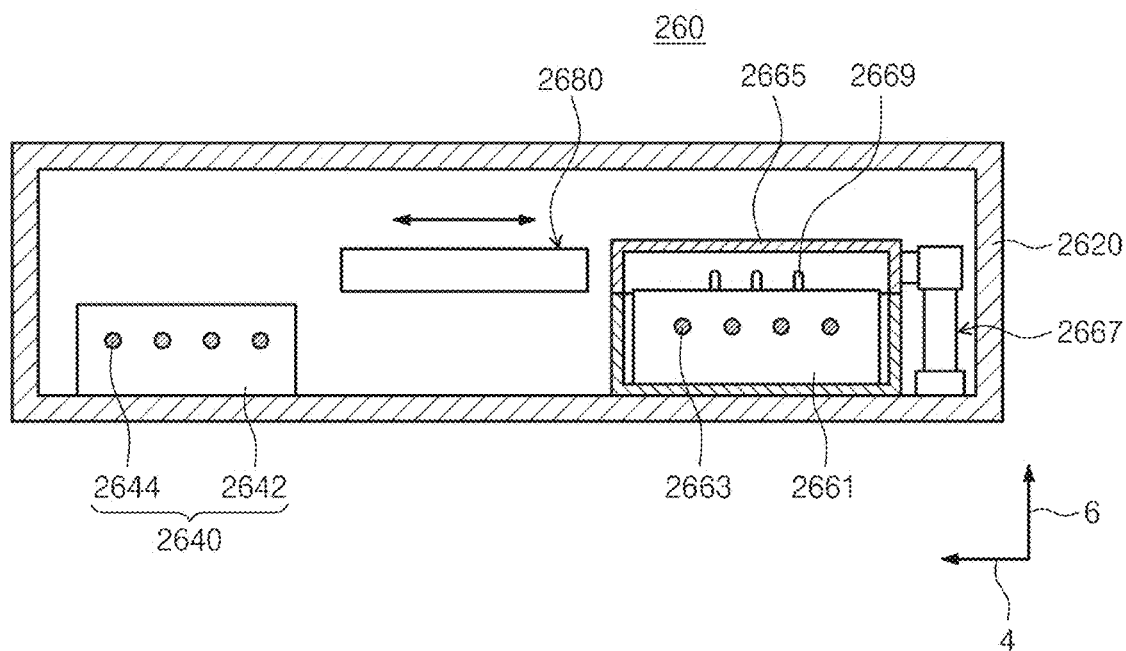
FIG. 6 is a front view of the heat treatment chamber of FIG. 5.

FIG. 5 is a schematic plan view illustrating one embodiment of the heat treatment chambers of FIG. 3, and FIG. 6 is a plan view of the heat treatment chamber of FIG. 5. Referring to FIGS. 5 and 6, the plurality of heat treatment chambers 260 are provided. The heat treatment chambers 260 are arranged in the first direction 2. The heat treatment chambers 260 are located on one side of the transfer chamber 220. Each of the heat treatment chambers 260 includes a housing 2620, a cooling unit 2640, a heating unit 2660, and a transfer plate 2680.

The housing 2620 has a substantially rectangular parallelepiped shape. The housing 2620 has a space therein. The housing 2620 has, in a sidewall thereof, an entrance/exit opening (not illustrated) through which a substrate W enters and exits the housing 2620. The entrance/exit opening may remain open. A door (not illustrated) may be provided to selectively open or close the entrance/exit opening.

The cooling unit 2640, the heating unit 2660, and the transfer plate 2680 are provided in the inner space of the housing 2620. The cooling unit 2640 and the heating unit 2660 are provided side by side in the second direction 4. According to an embodiment, the cooling unit 2640 may be located closer to the transfer chamber 220 than the heating unit 2660. The cooling unit 2640 includes a cooling plate 2642. The cooling plate 2642 may have a substantially circular shape when viewed from above. A cooling member 2644 is provided inside the cooling plate 2642. According to an embodiment, the cooling member 2644 may be formed inside the cooling plate 2642 and may serve as a fluid channel through which a cooling fluid flows.

The heating units 2660 provided in some of the heat treatment chambers 260 may improve adhesion of photoresist to the substrate W by supplying a gas while heating the substrate W. According to an embodiment, the gas may be a hexamethyldisilane gas.

Each of the heating units 2660 includes a heating plate 2661, a heater 2663, a cover 2665, and an actuator 2667. The heating plate 2661 has a substantially circular shape when viewed from above. The heating plate 2661 has a larger diameter than the substrate W. The heater 2663 is installed inside the heating plate 2661. The heater 2663 may be implemented with a resistance heating element to which an electric current is applied.

The heating plate 2661 includes lift pins 2669 that are vertically movable in the third direction 6. The lift pins 2669 receive the substrate W from a transfer unit outside the heating unit 2660 and lay the substrate W down on the heating plate 2661, or raise the substrate W off the heating plate 2661 and transfer the substrate W to the transfer unit outside the heating unit 2660. According to an embodiment, three lift pins 2669 may be provided.

The cover 2665 has a space therein, which is open at the bottom. The cover 2665 is located over the heating plate 2661 and is vertically moved by the actuator 2667. A space that the cover 2665 is moved to form together with the heating plate 2661 serves as a heating space in which the substrate W is heated.

The transfer plate 2680 has a substantially circular plate shape and has a diameter corresponding to that of the substrate W. The transfer plate 2680 has notches 2682 formed at the edge thereof. As many notches 2682 as the support protrusions 2244 formed on the transfer hand 2240 of the transfer robot 224 are provided. The notches 2682 are formed in positions corresponding to the support protrusions 2244. The substrate W is transferred between the transfer hand 2240 and the transfer plate 2680 when the vertical positions of the transfer hand 2240 and the transfer plate 2680 vertically aligned with each other are changed. The transfer plate 2680 may be mounted on a guide rail 2692 and may be moved along the guide rail 2692 by an actuator (not shown).

The transfer plate 2680 includes a plurality of guide grooves 2684 having a slit shape. The guide grooves 2684 extend inward from the edge of the transfer plate 2680. The lengthwise direction of the guide grooves 2684 is parallel to the second direction 4, and the guide grooves 2684 are spaced apart from each other in the first direction 2. The guide grooves 2684 prevent interference between the transfer plate 2680 and lift pins 2669 when the substrate W is transferred between the transfer plate 2680 and the heating unit 2660.

The substrate W is cooled in a state in which the transfer plate 2680 having the substrate W placed thereon is brought into contact with the cooling plate 2642. For efficient heat transfer between the cooling plate 2642 and the substrate W, the transfer plate 2680 is formed of a material having a high thermal conductivity. According to an embodiment, the transfer plate 2680 may be formed of a metallic material.

Referring again to FIGS. 2 and 3, the plurality of liquid treatment chambers 280 are provided. Some of the liquid treatment chambers 280 may be stacked one above another. The liquid treatment chambers 280 are disposed on an opposite side of the transfer chamber 220. The liquid treatment chambers 280 are arranged side by side in the first direction 2. Some of the liquid treatment chambers 280 are located adjacent to the index module 10. Hereinafter, these liquid treatment chambers 280 are defined as front liquid treatment chambers. Other liquid treatment chambers 280 are located adjacent to the interface module 50. Hereinafter, these liquid treatment chambers 280 are defined as rear liquid treatment chambers.

Each of the front liquid treatment chambers applies a first liquid to a substrate W, and each of the rear liquid treatment chambers applies a second liquid to the substrate W. The first liquid and the second liquid may be different types of liquids. According to an embodiment, the first liquid is an anti-reflection film, and the second liquid is photoresist. The photoresist may be applied to the substrate W coated with the anti-reflection film. Selectively, the first liquid may be photoresist, and the second liquid may be an anti-reflection film. In this case, the anti-reflection film may be applied to the substrate W coated with the photoresist. Selectively, the first liquid and the second liquid may be of the same type. Both the first liquid and the second liquid may be photoresist.

Figure 7:
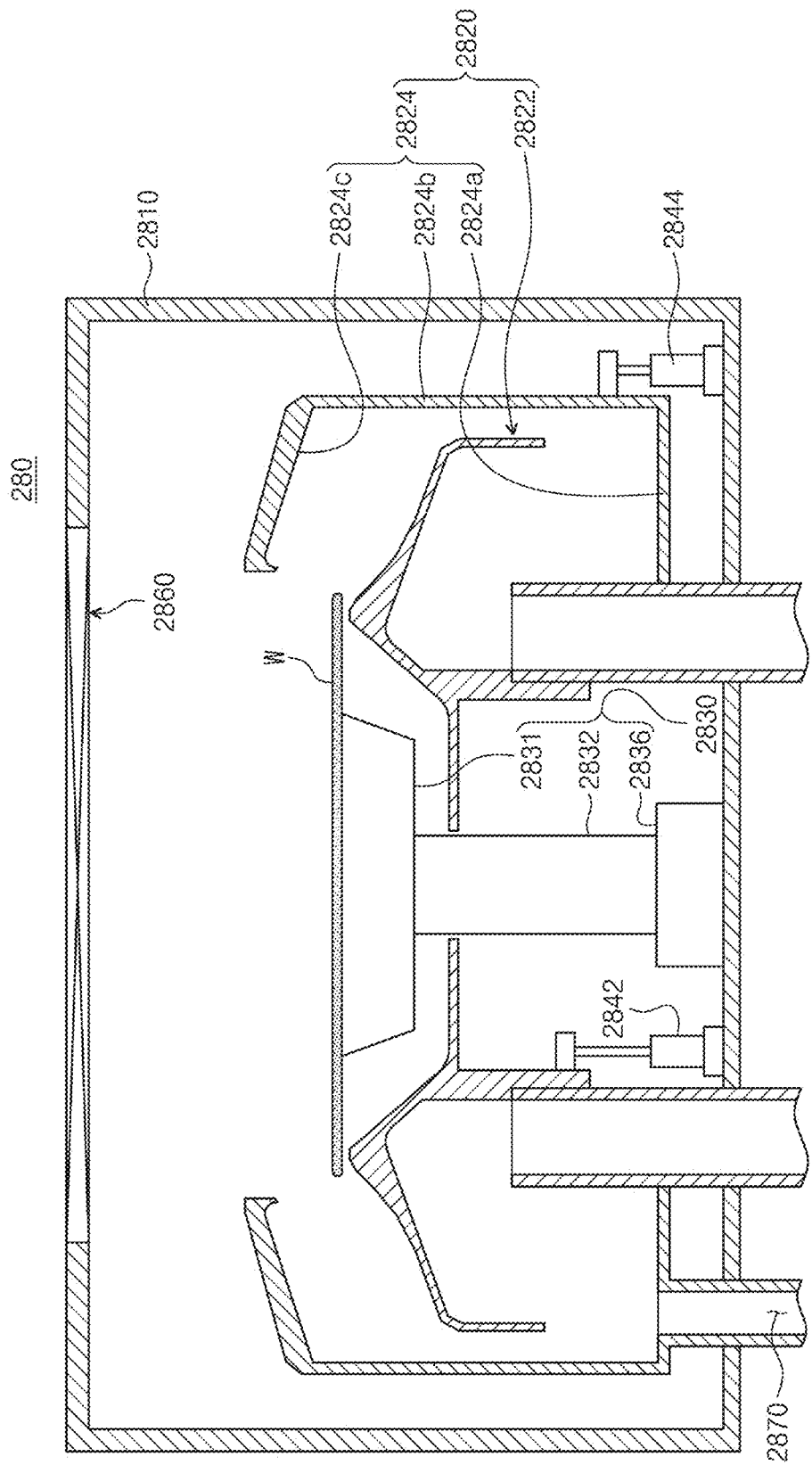
FIG. 7 is a schematic view illustrating one example of liquid treatment chambers of FIG. 3.

FIG. 7 is a schematic view illustrating one embodiment of the liquid treatment chambers of FIG. 3. Referring to FIG. 7, the liquid treatment chamber 280 includes a housing 2810, a treatment vessel 2820, and a support unit 2830.

The housing 2810 has a space therein. The housing 2810 has a substantially rectangular parallelepiped shape. An opening (not illustrated) may be formed in a sidewall of the housing 2810. The opening functions as an entrance/exit opening through which a substrate W enters and exits the inner space of the housing 2810. Furthermore, a door (not illustrated) may be provided in a region adjacent to the opening to selectively open or close the opening. The door may block the opening to seal the inner space while a process is performed on the substrate W placed in the inner space. The treatment vessel 2820 and the support unit 2830 are disposed in the housing 2810.

The treatment vessel 2820 may have a treatment shape that is open at the top. The treatment vessel 2820 may be a bowl having a treatment space. The inner space may surround the treatment space. The treatment vessel 2820 may have a cup shape that is open at the top. The treatment space of the treatment vessel 2820 may be a space in which the support unit 2830 to be described below supports and rotates the substrate W. The treatment space may be a space in which a liquid supply unit 3000 to be described below supplies a liquid to treat the substrate W.

According to an embodiment, the treatment vessel 2820 may include an inner cup 2822 and an outer cup 2824. The outer cup 2824 may surround the support unit 2830, and the inner cup 2822 may be located inside the outer cup 2824. The inner cup 2822 and the outer cup 2824 may each have an annular ring shape when viewed from above. The space between the inner cup 2822 and the outer cup 2824 may be provided as a recovery path along which the liquid introduced into the treatment space is recovered.

The inner cup 2822, when viewed from above, may have a shape surrounding a support shaft 2832 of the support unit 2830 to be described below. For example, the inner cup 2822, when viewed from above, may have a circular plate shape surrounding the support shaft 2832. When viewed from above, the inner cup 2822 may be located to overlap an exhaust line 2870 coupled to the housing 2810.

The inner cup 2822 may have an inner part and an outer part. The upper surface of the inner part and the upper surface of the outer part may have different angles with respect to a virtual horizontal line. For example, the inner part, when viewed from above, may be located to overlap a body 2831 of the support unit 2830 to be described below. The inner part may be located to face the support shaft 2832. The upper surface of the inner part may be inclined upward while getting farther away from the support shaft 2832, and the outer part may extend outward from the inner part. The upper surface of the outer part may be inclined downward while getting farther away from the support shaft 2832. The upper end of the inner part may be vertically aligned with the lateral end portion of the substrate W. In an embodiment, the point at which the outer part and the inner part meet each other may be located in a lower position than the upper end of the inner part. The point at which the inner part and the outer part meet each other may be rounded. The outer part may be combined with the outer cup 2824 to form a recovery path along which a treatment medium is recovered.

The outer cup 2824 may have a cup shape that surrounds the support unit 2830 and the inner cup 2822. The outer cup 2824 may include a bottom portion 2824a, a side portion 2824b, and an inclined portion 2824c.

The bottom portion 2824a may have a circular plate shape having an empty space. A recovery line 2870 may be connected to the bottom portion 2824a. The recovery line 2870 may be used to recover the treatment medium supplied onto the substrate W. The treatment medium recovered by the recovery line 2870 may be reused by an external regeneration system (not illustrated).

The side portion 2824b may have an annular ring shape that surrounds the support unit 2830. The side portion 2824b may vertically extend from the lateral end of the bottom portion 2824a. The side portion 2824b may extend upward from the bottom portion 2824a.

The inclined portion 2824c may extend from the upper end of the side portion 2824b in a direction toward the central axis of the outer cup 2824. The inside surface of the inclined portion 2824c may be inclined upward so as to be close to the support unit 2830. The inclined portion 2824c may have a ring shape. While a treatment process is performed on the substrate W, the upper end of the inclined portion 2824c may be located in a higher position than the substrate W supported on the support unit 2830.

The support unit 2830 supports and rotates the substrate W in the treatment space. The support unit 2830 may be a chuck that supports and rotates the substrate W. The support unit 2830 may include the body 2831, the support shaft 2832, and an actuator 2836. The body 2831 may have an upper surface on which the substrate W is seated. The upper surface of the body 2831 may have a substantially circular shape when viewed from above. The upper surface of the body 2831 may have a smaller diameter than the substrate W. Suction holes (not illustrated) may be formed in the body 2831, and the body 2831 may clamp the substrate W by vacuum pressure. Selectively, the body 2831 may be implemented with an electrostatic plate (not illustrated) and may clamp the substrate W by electrostatic attraction. Selectively, the body 2831 may include support pins that support the substrate W, and the support pins may make physical contact with the substrate W to clamp the substrate W.

The support shaft 2832 is coupled with the body 2831. The support shaft 2832 is coupled with the lower surface of the body 2831. The support shaft 2832 may be disposed such that the lengthwise direction thereof is parallel to the up/down direction. The support shaft 2832 is rotatable by power transmitted from the actuator 2836. The support shaft 2832 is rotated by rotation of the actuator 2836 to rotate the body 2831. The actuator 2836 may adjust the rotational speed of the support shaft 2832. The actuator 2836 may be a motor that provides a driving force. However, without being limited thereto, the actuator 2836 may be implemented with various well-known devices that provide a driving force.

A lifting unit 2842, 2844 is disposed in the housing 2810. The lifting unit 2842, 2844 adjusts the height of the treatment vessel 2820 relative to the support unit 2830. The lifting unit 2842, 2844 linearly moves the treatment vessel 2820 in the third direction 6. The lifting unit 2842, 2844 may include an inner lifting member 2842 and an outer lifting member 2844. The inner lifting member 2842 may vertically move the inner cup 2822. The outer lifting member 2844 may vertically move the outer cup 2824.

The exhaust line 2870 may be provided outside the liquid treatment chamber 280. A pressure reducing unit (not illustrated) is connected to the exhaust line 2870. The exhaust line 2870 exhausts the atmosphere in the treatment space by the pressure reducing unit. The exhaust line 2870 may be coupled with the treatment vessel 2820. Selectively, the exhaust line 2870 may be coupled to the bottom portion 2824a of the outer cup 2824. The exhaust line 2870 may be located to overlap the inner cup 2822 when viewed from above.

An air-flow supply unit 2860 supplies an air flow into the inner space of the housing 2810. The air-flow supply unit 2860 may supply a downward air flow into the inner space. The air-flow supply unit 2860 may supply an air flow, the temperature and/or humidity of which is adjusted, into the inner space. The air-flow supply unit 2860 may be installed on the housing 2810. The air-flow supply unit 2860 may be provided over the treatment vessel 2820 and the support unit 2830.

Figure 8:
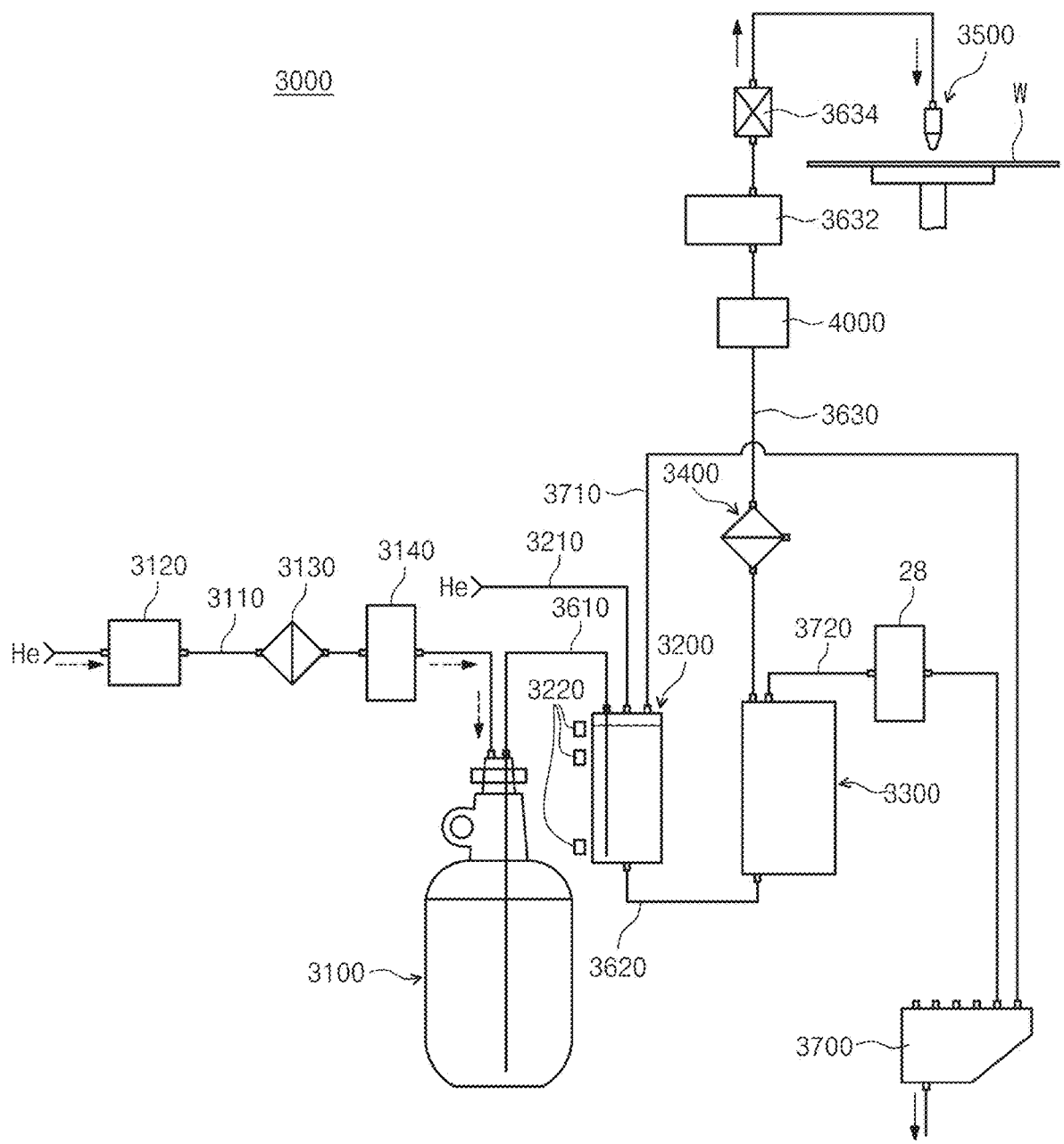
FIG. 8 is a schematic view illustrating a liquid supply unit for supplying a liquid into the liquid treatment chamber of FIG. 7.

FIG. 8 is a schematic view illustrating the liquid supply unit for supplying the liquid into the liquid treatment chamber of FIG. 7. Hereinafter, the liquid supply unit according to an embodiment of the inventive concept will be described in detail with reference to FIG. 8.

The liquid supply unit 3000 may supply the liquid to the substrate W located in the liquid treatment chamber 280. The liquid supply unit 3000 may supply the liquid to the substrate W supported on the support unit 2830. The liquid that the liquid supply unit 3000 supplies to the substrate W may be a coating solution. For example, the coating solution may be a photosensitive liquid such as photoresist (PR). Furthermore, the liquid supply unit 3000 may supply a pre-wetting liquid to the substrate W supported on the support unit 2830. The pre-wetting liquid supplied to the substrate W by the liquid supply unit 3000 may be a liquid that can change a surface property of the substrate W. For example, the pre-wetting liquid may be a liquid that can change the surface property of the substrate W to a hydrophobic property. For example, the pre-wetting liquid may be thinner. Hereinafter, for convenience of description, it will be exemplified that the liquid supplied by the liquid supply unit is photoresist.

The liquid supply unit 3000 may include a main tank 3100, a trap tank 3200, a pump 3300, a filter 3400, a liquid supply nozzle 3500, a liquid supply line 3610, 3620, 3630, and a waste liquid tank 3700. The main tank 3100 may form a sealed inner space. The main tank 3100 has the liquid stored in the inner space thereof. For example, the main tank 3100 may have photoresist stored therein. A first inert gas supply line 3110 and a first supply line 3610 to be described below may be connected to the main tank 3100.

The first inert gas supply line 3110 may supply an inert gas into the inner space of the main tank 3100. A regulator 3120, a gas filter 3130, and an air-operated valve 3140 may be sequentially disposed in-line with the first inert gas supply line 3110. The inert gas may be supplied through the regulator 3120. For example, the inert gas may be helium gas or nitrogen gas. When the inert gas is supplied into the main tank 3100, the photoresist stored in the main tank 3100 may be moved into the trap tank 3200 due to a relative pressure difference. The gas filter 3130 may filter the inert gas flowing through the first inert gas supply line 3110. For example, the gas filter 3130 may filter impurities from the inert gas. The air-operated valve 3140 may open or close the first inert gas supply line 3110. For example, the air-operated valve 3140 may close the first inert gas supply line 3110 only when the main tank 3100 is replaced.

The trap tank 3200 may form a sealed inner space. The trap tank 3200 has the liquid stored in the inner space thereof. For example, the trap tank 3200 may have photoresist stored therein. The photoresist provided through the first supply line 3610 may be stored in the trap tank 3200. A level sensor 3220 may be installed on one side of the trap tank 3200. The level sensor 3220 may sense the level of the photoresist stored in the trap tank 3200 and may allow the photoresist to be continually stored in the trap tank 3200 to an appropriate level.

A second inert gas supply line 3210, the first supply line 3610, a second supply line 3620 to be described below, and a first drain line 3710 may be connected to the trap tank 3200. The second inert gas supply line 3210 may be connected to the upper end of the trap tank 3200. The second inert gas supply line 3210 may supply an inert gas into the inner space of the trap tank 3200. The second inert gas supply line 3210 is similar to the above-described first inert gas supply line 3110. Therefore, to avoid repetitive description, description of the second inert gas supply line 3210 will be omitted.

The first supply line 3610 and the first drain line 3710 may be connected to the upper end of the trap tank 3200. The first supply line 3610 may supply the photoresist from the main tank 3100 to the trap tank 3200. The first drain line 3710 may be connected to the waste liquid tank 3700 to be described below. The second supply line 3620 may be connected to the lower end of the trap tank 3200. The second supply line 3620 may be connected with the pump 3300 to be described below and may supply the photoresist from the trap tank 3200 to the pump 3300.

The pump 3300 supplies the liquid stored in the trap tank 3200 to the liquid supply nozzle 3500. For example, the pump 3300 may supply the photoresist stored in the trap tank 3200 to the liquid supply nozzle 3500. The pump 3300 may supply the photoresist stored in the trap tank 3200 by a required amount. For example, the pump 3300 may be a bellows-driven tubephragm pump that supplies the photoresist stored in the trap tank 3200 to the liquid supply nozzle 3500 by flow pressure generated by suction and discharge operations. For example, the pump 3300 may suck, from the trap tank 3200, 1 dose of photoresist that can be supplied onto the substrate W and may discharge the photoresist to the liquid supply nozzle 3500 at constant pressure and flow rate when a coating process is performed on the substrate W. However, without being limited thereto, the pump 3300 may be implemented with various well-known pumps that can provide flow pressure.

The second supply line 3620, a third supply line 3630, and a second drain line 3720 may be connected to the pump 3300. For example, the second supply line 3620 may be connected to the lower end of the pump 3300. A check valve (not illustrated) may be disposed in line-with the second supply line 3620. The photoresist may be supplied from the trap tank 3200 to the pump 3300 through the second supply line 3620.

For example, the third supply line 3630 may be connected to the upper end of the pump 3300. One end of the third supply line 3630 may be connected to the pump 3300, and an opposite end of the third supply line 3630 may be connected to the filter 3400 to be described below. A check valve (not illustrated), a suck-back valve 3632, a cut-off valve 3634, and the filter 3400 to be described below may be disposed in-line with the third supply line 3630. The photoresist may be supplied from the pump 3300 to the liquid supply nozzle 3500 to be described below through the third supply line 3630. For example, the second drain line 3720 may be connected to the upper end of the pump 3300. One end of the second drain line 3720 may be connected to the pump 3300, and an opposite end of the second drain line 3720 may be connected to the waste liquid tank 3700 to be described below.

The filter 3400 may filter the liquid supplied from the pump 3300 to the liquid supply nozzle 3500. For example, the filter 3400 may filter the photoresist supplied from the pump 3300 to the liquid supply nozzle 3500. The filter 3400 may filter impurities from the photoresist. The filter 3400 may be disposed in-line with the third supply line 3630.

The liquid supply nozzle 3500 may supply the liquid to the substrate W. For example, the liquid supply nozzle 3500 may supply the photoresist to the substrate W supported on the support unit 2830. The liquid supply nozzle 3500 may be moved by an actuator (not illustrated).

The liquid supply line 3610, 3620, 3630 may include the first supply line 3610, the second supply line 3620, and the third supply line 3630. The first supply line 3610 connects the main tank 3100 and the trap tank 3200. One end of the first supply line 3610 may be connected to the main tank 3100, and an opposite end of the first supply line 3610 may be connected to the trap tank 3200. The second supply line 3620 connects the trap tank 3200 and the pump 3300. One end of the second supply line 3620 may be connected to the trap tank 3200, and an opposite end of the second supply line 3620 may be connected to the pump 3300. The third supply line 3630 is connected to the pump 3300 and the liquid supply nozzle 3500. One end of the third supply line 3630 may be connected to the pump 3300, and an opposite end of the third supply line 3630 may be connected to the liquid supply nozzle 3500.

The waste liquid tank 3700 may be connected to the first drain line 3710 and the second drain line 3720. The first drain line 3710 may connect the trap tank 3200 and the waste liquid tank 3700. One end of the first drain line 3710 may be connected to the trap tank 3200, and an opposite end of the first drain line 3710 may be connected to the waste liquid tank 3700. The first drain line 3710 may remove bubbles collected in the upper end portion of the trap tank 3200, or may passively drain the photoresist to the waste liquid tank 3700 in response to a change in the property of the photoresist.

The second drain line 3720 may connect the pump 3300 and the waste liquid tank 3700. The one end of the second drain line 3720 may be connected to the pump 3300, and the opposite end of the second drain line 3720 may be connected to the waste liquid tank 3700. An air-operated valve 3722 may be disposed in-line with the second drain line 3720. The second drain line 3720 may remove bubbles collected in the upper end portion of the pump 3300, or may passively drain the photoresist to the waste liquid tank 3700 in response to a change in the property of the photoresist.

Figure 9:
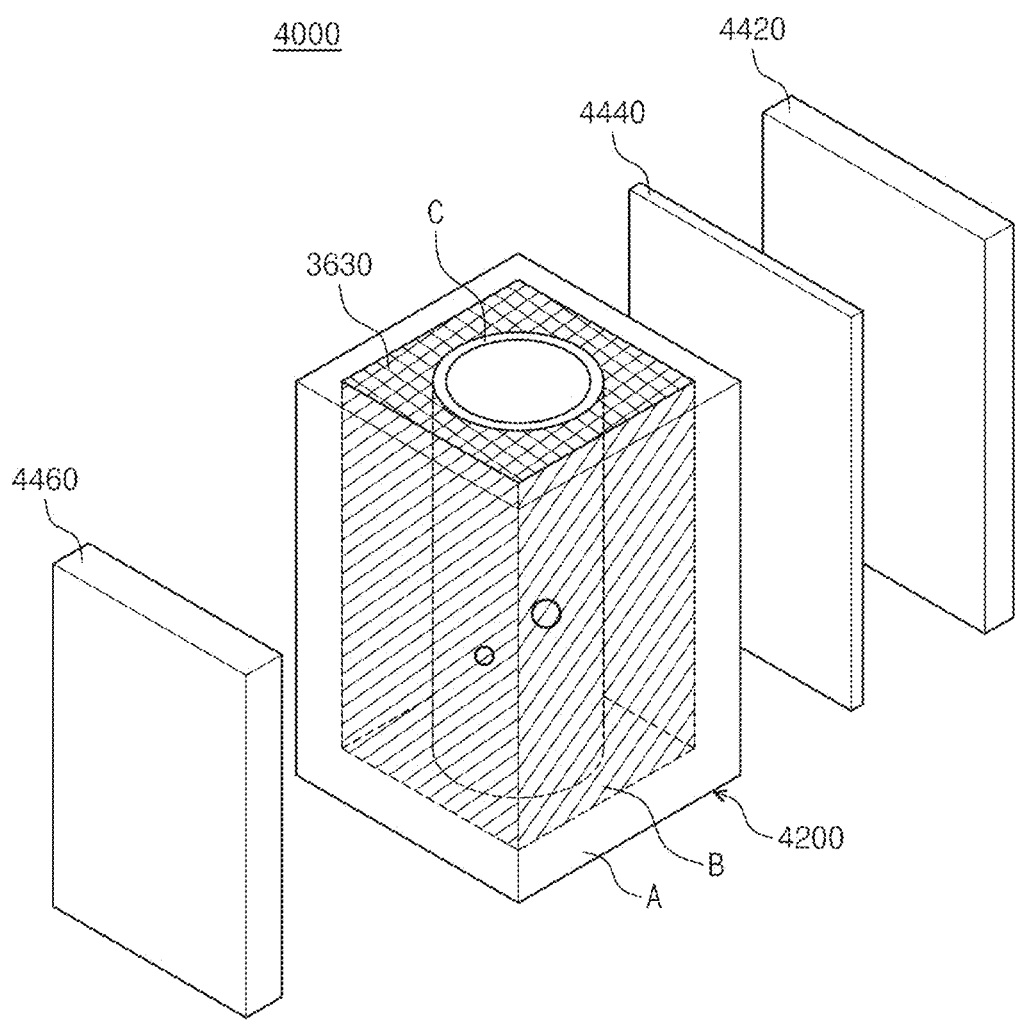
FIG. 9 is a schematic perspective view illustrating a bubble measurement unit provided in the liquid supply unit of FIG. 8.
Figure 10:
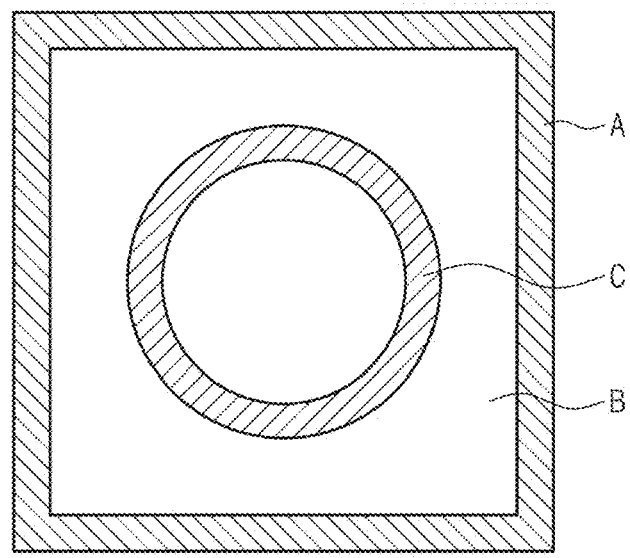
FIG. 10 is a top view of a cover of FIG. 9.
Figure 11:
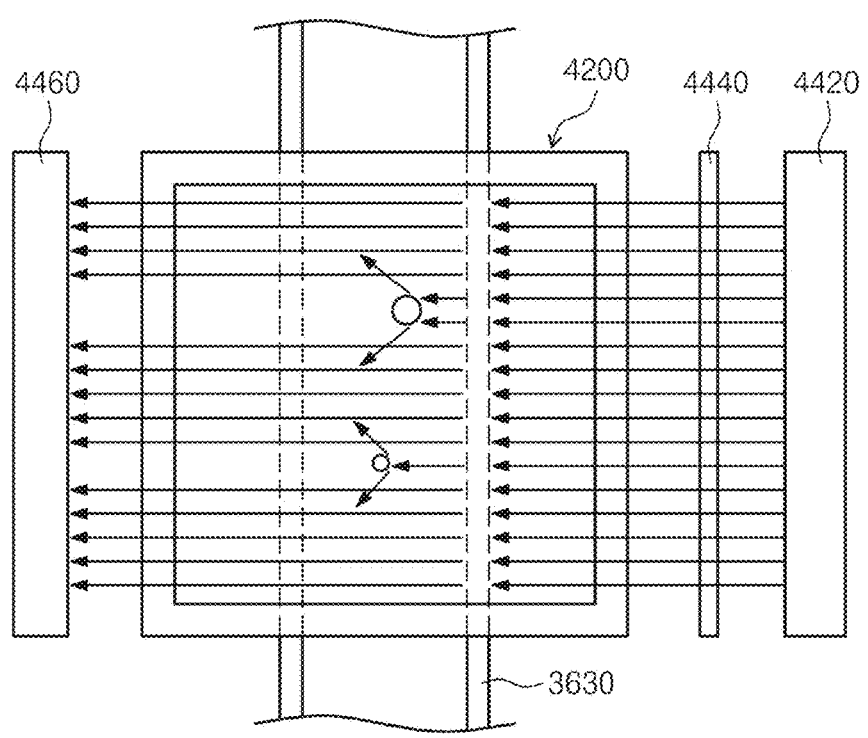
FIG. 11 is a front view of the bubble measurement unit of FIG. 9.

FIG. 9 is a schematic perspective view illustrating a bubble measurement unit provided in the liquid supply unit of FIG. 8. FIG. 10 is a top view of a cover of FIG. 9. FIG. 11 is a front view of the bubble measurement unit of FIG. 9. Hereinafter, the bubble measurement unit according to an embodiment of the inventive concept will be described in detail with reference to FIGS. 8 to 11.

The bubble measurement unit 4000 may measure bubbles contained in the liquid flowing in a component provided in the liquid supply unit 3000. The bubble measurement unit 4000 may measure bubbles contained in the photoresist flowing in the component provided in the liquid supply unit 3000. The bubble measurement unit 4000 may be installed on the component provided in the liquid supply unit 3000.

The component provided in the liquid supply unit 3000 is defined as a concept including various components included in the liquid supply unit 3000. For example, the component provided in the liquid supply unit 3000 may be the main tank 3100, the trap tank 3200, the pump 3300, the filter 3400, the liquid supply nozzle 3500, or the liquid supply line 3610, 3620, 3630. For example, the component provided in the liquid supply unit 3000 may include the first supply line 3610, the second supply line 3620, or the third supply line 3630. For example, the component may have a curved cross-section perpendicular to the lengthwise direction thereof. In an embodiment of the inventive concept, for convenience of description, it will be exemplified that the bubble measurement unit 4000 is disposed on the third supply line 3630.

The bubble measurement unit 4000 may include the cover 4200 and an inspection unit 4400. The cover 4200 may have a substantially rectangular parallelepiped shape. However, the inventive concept is not limited thereto. A first surface of the cover 4200 provided in a position facing a light source 4420 to be described below and a second surface of the cover 4200 provided in a position facing a light receiving part 4460 to be described below may be flat. The first surface and the second surface may be parallel to each other.

The cover 4200 may be installed on the component. The cover 4200 installed on the component may provide an inspection area. The area of the cover 4200 installed on the component may be provided as the inspection area for detecting bubbles existing in the component. For example, the cover 4200 may be installed on the third supply line 3630 and may provide the inspection area for detecting bubbles existing in the photoresist flowing in the third supply line 3630.

The cover 4200 may be formed of a light transmitting material. The material A of the cover 4200 may have a refractive index greater than the refractive index of a material B to be described below and the refractive index of the material C of the component. For example, the material A of the cover 4200 may be acrylic. The cover 4200 may surround the component. Accordingly, a space may be provided between the cover 4200 and the component. The space formed between the cover 4200 and the component may be filled with the material B having the same refractive index as the material C of the component. For example, the material B filling the space may be a liquid. However, without being limited thereto, the material B filling the space may have various phases having the same refractive index as the material C of the component. For example, the material B filling the space may have the same refractive index as the material C of the pipe of the third supply line 3630. When the material B has the same refractive index as the material C of the pipe of the third supply line 3630, it may mean that the refractive indexes of the materials B and C are not exactly the same, but are in a similar range.

The inspection unit 4400 inspects bubbles contained in the liquid flowing in the component in the inspection area of the component on which the cover 4200 is installed. For example, the inspection unit 4400 may inspect bubbles contained in the photoresist flowing in the third supply line 3630 in the inspection area of the third supply line 3630 on which the cover 4200 is installed. The inspection unit 4400 may include the light source 4420, a diffusion plate 4440, the light receiving part 4460, and an inspection part (not shown).

The light source 4420 may be located outside the cover 4200. For example, outside the cover 420, the light source 4420 may be provided in a position facing the first surface of the cover 4200. The first surface of the cover 4200 may be provided as an irradiation surface. The irradiation surface may be flat. The light source 4420 may apply light toward the inspection area. The light applied by the light source 4420 may be incident on the first surface in the direction perpendicular thereto. For example, the light source 4420 may be implemented with a light emitting diode (LED). Selectively, the light source 4420 may be implemented with a halogen lamp.

The diffusion plate 4440 may diffuse the light applied by the light source 4420. The diffusion plate 4440 may evenly diffuse the light applied by the light source 4420 over a wide area. The diffusion plate 4440 may input the light applied by the light source 4420 to the entire inspection area. The diffusion plate 4440 may be located between the light source 4420 and the cover 4200. For example, the diffusion plate 4440 may be located between the light source 4420 and the first surface of the cover 4200.

The light receiving part 4460 may be located outside the cover 4200. For example, outside the cover 420, the light receiving part 4460 may be provided in a position facing the second surface of the cover 4200 that faces the first surface of the cover 4200. The second surface may be flat. The second surface may be parallel to the first surface. The light applied by the light source 4420 may be incident on the second surface in the direction perpendicular thereto. The light receiving part 4460 may receive the light passing through the inspection area.

The inspection part (not shown) may obtain a bubble image from the received light. The inspection part (not shown) may inspect bubbles existing in the component from the light received by the light receiving part 4460. The inspection part (not shown) may inspect a presence or absence of bubbles and the number and sizes of bubbles from the bubble image obtained from the light receiving part 4460. For example, from the bubble image obtained from the light receiving part 4460, the inspection part (not shown) may inspect a presence or absence of bubbles in the inspection area provided for the third supply line 3630 and the number and sizes of bubbles.

Referring to FIG. 11, the light applied by the light source 4420 may sequentially pass through the diffusion plate 4440, the first surface of the cover 4200, the material B filling the space between the cover 4200 and the component, the component provided in the liquid supply unit, and the second surface of the cover 4200 and may be received by the light receiving part 4460. For example, the light applied by the light source 4420 may sequentially pass through the diffusion plate 4440, the first surface of the cover 4200, the material B filling the space between the cover 4200 and the third supply line 3630, the third supply line 3630, and the second surface of the cover 4200 and may be received by the light receiving part 4460.

Because the space between the cover 4200 and the third supply line 3630 is filled with the material B having the same refractive index as the material C of the pipe of the third supply line 3630, the light applied by the light source 4420 may not be refracted at the interface between the pipe of the third supply line 3630 and the material B. Accordingly, light incident on a partial region of the inspection area where bubbles do not exist in the third supply line 3630 is not refracted and is received by the light receiving part 4460.

Light incident on a partial region of the inspection area where bubbles exist in the third supply line 3630 is refracted at the boundaries of the bubbles. Accordingly, on a virtual straight line connecting the light source 4420, the cover 4200, and the light receiving part 4460, no light is received on a line corresponding to the region where the bubbles exist. A shadow is formed in the region where the bubbles exist. The inspection part (not shown) may detect an image in which the shadow exists in the inspection area as a bubble image. Furthermore, the inspection part (not shown) may detect the region of the inspection area where the shadow exists as the region where the bubbles are formed. The inspection part (not shown) may obtain a bubble image of the region of the inspection area where the light applied by the light source 4420 is not received so that no light is received from the light receiving part 4460, that is, the region where the shadow is formed in the third supply line 3630. The inspection part (not shown) may obtain the bubble image from the light received from the light receiving part 4460 and may inspect a presence or absence of bubbles in the inspection area and the number and sizes of bubbles.

The component may have a curved cross-section perpendicular to the lengthwise direction thereof. Light applied toward the boundary of the component having a curved cross-section may be reflected or refracted. Due to the reflection or refraction of the light, the shapes of bubbles flowing in the component may be distorted. Therefore, it is difficult to detect the bubbles contained in the liquid flowing in the component by applying light toward the component. This hinders accurate measurement of the number and sizes of bubbles flowing in the component. This problem is further exacerbated when the bubbles flowing in the component have an extremely small size.

According to the above-described embodiment of the inventive concept, by filling the space between the cover 4200 and the component with the material B having the same refractive index as the material C of the component, scattering or refraction of light incident toward the component may be minimized at the boundary of the component. Bubbles contained in the liquid flowing in the component have curvatures. Even though light is applied toward the component, the applied light is reflected or refracted only at the boundaries of the bubbles. A shadow may be formed only in a partial region of the inspection area where the bubbles exist. Accordingly, an image of the bubbles flowing in the component may be accurately obtained.

According to the above-described embodiment of the inventive concept, the first surface of the cover 4200 is flat such that light applied by the light source 4420 is incident in the direction perpendicular to the first surface of the cover 4200. Accordingly, even though the component has a curved cross-section perpendicular to the lengthwise direction thereof, refraction of the applied light at the boundary of the component may be minimized. Thus, distortion of a region where bubbles do not exist may be minimized.

In the above-described embodiment of the inventive concept, the bubble measurement unit 4000 has been described as being installed on the component provided in the liquid supply unit 3000. However, without being limited thereto, a plurality of covers 4200 may be installed on components provided in the liquid supply unit 3000. In this case, the bubble measurement unit 4000 may detect an image of bubbles contained in the liquid flowing in an inspection area provided in each of the covers 4200 while moving on a non-illustrated rail.

In the above-described embodiment of the inventive concept, the bubble measurement unit 4000 has been described as being installed on the component included in the liquid supply unit that supplies a coating solution or a developing solution onto the substrate W. However, without being limited thereto, the bubble measurement unit 4000 may be similarly provided for a semiconductor apparatus that supplies various liquids, such as a liquid supply apparatus that supplies a cleaning solution onto a substrate W, an apparatus for treating a substrate for manufacture of a flat panel display, or the like.

Referring again to FIGS. 1 to 3, each of the developing blocks 20b has a transfer chamber 220, a buffer chamber 140, heat treatment chambers 260, and liquid treatment chambers 280. The transfer chamber 220, the buffer chamber 140, the heat treatment chambers 260, and the liquid treatment chambers 280 of the developing block 20b are provided in a structure and arrangement similar to the structure and arrangement of the transfer chamber 220, the buffer chamber 140, the heat treatment chambers 260, and the liquid treatment chambers 280 of the coating block 20a, and therefore descriptions thereabout will be omitted. However, all of the liquid treatment chambers 280 of the developing block 20*b* perform a developing process of developing a substrate W by supplying a developing solution in the same manner.

The interface module 50 connects the treating module 20 and an external exposure apparatus 60. The interface module 50 includes an interface frame 520, an additional process chamber 540, an interface buffer 560, and a transfer member 580.

The interface frame 520 has a space therein. A fan filter unit for forming a downward air flow in the inner space may be provided at the upper end of the interface frame 520. The additional process chamber 540, the interface buffer 560, and the transfer member 580 are provided in the inner space of the interface frame 520.

The additional process chamber 540 may perform a predetermined additional process before a substrate W treated in the coating block 20*a* is transferred to the exposure apparatus 60. Selectively, the additional process chamber 540 may perform a predetermined additional process before the substrate W treated in the exposure apparatus 60 is transferred to the developing block 20*b*. According to an embodiment, the additional process may be an edge exposing process of exposing the edge region of the substrate W to light, a top-side cleaning process of cleaning the top side of the substrate W, or a backside cleaning process of cleaning the backside of the substrate W. A plurality of additional process chambers 540 may be provided. The additional process chambers 540 may be stacked one above another. The additional process chambers 540 may all perform the same process. Selectively, some of the additional process chambers 540 may perform different processes.

The interface buffer 560 provides a space in which the substrate W transferred between the coating blocks 20*a*, the additional process chambers 540, the exposure apparatus 60, and the developing blocks 20*b* temporarily stays while being transferred. A plurality of interface buffers 560 may be provided. The interface buffers 560 may be stacked one above another. According to an embodiment, the additional process chambers 540 may be disposed on one side of an extension line facing in the lengthwise direction of the transfer chamber 220, and the interface buffers 560 may be disposed on an opposite side of the extension line.

The transfer member 580 transfers the substrate W between the coating blocks 20*a*, the additional process chambers 540, the exposure apparatus 60, and the developing blocks 20*b*. The transfer member 580 may be implemented with one or more robots. According to an embodiment, the transfer member 580 includes the first robot 5820, a second robot 5840, and a third robot (not shown). The first robot 5820 transfers the substrate W between the coating blocks 20*a*, the additional process chambers 540, and the interface buffers 560. The second robot 5840 transfers the substrate W between the interface buffers 560 and the exposure apparatus 60. The third robot 5860 transfers the substrate W between the interface buffers 560 and the developing blocks 20*b*.

Each of the first robot 5820, the second robot 5840, and the third robot (not shown) includes a hand on which the substrate W is placed. The hand is movable forward and backward, rotatable about an axis facing in the third direction 6, and movable in the third direction 6. The hands of the first robot 5820, the second robot 5840, and the third robot (not shown) may all have the same shape as, or a shape similar to, that of the transfer hand 2240 of the transfer robot 224. Selectively, the hand of the robot that directly exchanges the substrate W with the cooling plate 2642 of each heat treatment chamber may have the same shape as, or a shape similar to, that of the transfer hand 2240 of the transfer robot 224, and the hands of the remaining robots may have a different shape from the transfer hand 2240 of the transfer robot 224.

Hereinafter, other embodiments of the support unit of FIG. 7 will be described. The remaining components other than the body 2831 of the support unit 2830 in the above-described embodiment of the inventive concept are similarly provided in the other embodiments of the inventive concept. Accordingly, in order to avoid duplication of description, descriptions of the similarly provided components will be omitted.

Figure 12:
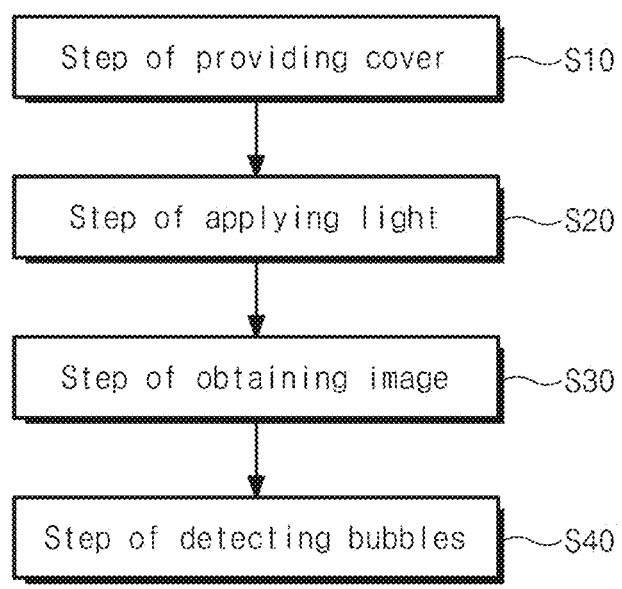
FIG. 12 is a flowchart illustrating a bubble measurement method according to an embodiment of the inventive concept.

FIG. 12 is a flowchart illustrating a bubble measurement method according to an embodiment of the inventive concept. Hereinafter, the bubble measurement method according to the embodiment of the inventive concept will be described with reference to FIG. 12.

The bubble measurement method may be used to measure bubbles contained in a liquid that is stored in a component or flows in the component. For example, the bubble measurement method may be used to measure bubbles contained in a liquid that is stored in a component provided in the liquid supply unit 3000 or flows in the liquid supply unit 3000. The bubble measurement method may include step S10 of providing a cover, step S20 of applying light, step S30 of obtaining an image, and step S40 of detecting bubbles.

Step S10 of providing the cover is a step of installing the cover 4200. The cover 4200 is provided to surround the component. The area of the component surrounded by the cover 4200 is provided as an inspection area. The inspection area is an area for detecting bubbles flowing in the component. A plurality of covers 4200 may be installed on a plurality of components, respectively.

In step S10 of providing the cover, the space between the cover 4200 and the component is filled with the material B having the same refractive index as the material C of the component. Furthermore, the material of the cover 4200 may have a refractive index greater than the refractive index of the material B and the refractive index of the material C of the component. When the material B has the same refractive index as the material C of the pipe, it may mean that the refractive indexes of the materials B and C are not exactly the same, but are in a similar range.

Step S20 of applying the light is a step of applying, by the light source 4420, light to the inspection area. The light source 4420 is located outside the cover 4200. The light source 4420 may be provided in a position facing the first surface of the cover 4200 so as to be spaced apart from the first surface of the cover 4200. The light source 4420 applies the light toward the first surface of the cover 4200. The light applied toward the first surface is incident perpendicular to the first surface. For example, the light applied by the light source 4420 may be evenly diffused through the diffusion plate 4440 toward the first surface and may be incident perpendicular to the first surface.

Step S30 of obtaining the image is a step of receiving, by the light receiving part 4460, the light applied by the light source 4420 and obtaining, by the inspection part (not shown), an image from the received light. The light receiving part 4460 is located outside the cover 4200. The light receiving part 4460 may be provided in a position facing the second surface facing the first surface of the cover 4200 so as to be spaced apart from the second surface of the cover 4200. The first surface and the second surface are parallel to each other. Accordingly, the light applied from the light source 4420 to the inspection area may be incident perpendicular to the first surface and the second surface. The light applied from the light source 4420 to the inspection area sequentially passes through the diffusion plate 4440, the first surface (the material A of the cover), the material B filling the space between the cover 4200 and the component, the material C of the component, and the second surface (the material A of the cover) and is received by the light receiving part 4460. The light applied from the light source 4420 toward the inspection area is received by the light receiving par 4460.

Because the space between the cover 4200 and the component is filled with the material B having the same refractive index as the material C of the component, the light applied by the light source 4420 may not be refracted at the boundary of the component. Accordingly, light incident on a partial region of the inspection area where bubbles do not exist in the component is not refracted and is received by the light receiving part 4460. Light incident on a partial region of the inspection area where bubbles exist in the third supply line 3630 is refracted at the boundaries of the bubbles. Accordingly, on a virtual straight line connecting the light source 4420, the cover 4200, and the light receiving part 4460, no light is received on a line corresponding to the region where the bubbles exist. Thus, when bubbles exist in the component, the inspection part (not shown) may obtain an image in which a shadow is formed and an image in which a shadow is not formed.

Step S40 of detecting the bubbles is a step of analyzing a bubble image for the image obtained from the light receiving part 4460 by the inspection part (not shown) in step S30 of obtaining the image. As described above, no light is received from a region where bubbles exist to the light receiving part 4460, and therefore a shadow is formed. The inspection part (not shown) may detect the region where the shadow exists in the inspection area as an area where bubbles are formed. Accordingly, in step S40 of detecting the bubbles, the bubbles contained in the liquid that is stored in the component or flows in the component may be detected from the image obtained in step S30 of obtaining the image. The inspection part (not shown) may inspect a presence or absence of bubbles and the number and sizes of bubbles from the bubble image obtained from the light receiving part 4460.

According to the above-described embodiment of the inventive concept, by filling the space between the cover 4200 and the component with the material B having the same refractive index as the material C of the component, scattering or refraction of light incident toward the component may be minimized at the boundary of the component. The bubbles contained in the liquid flowing in the component have curvatures. Even though light is applied toward the component, the applied light is reflected or refracted only at the boundaries of the bubbles. A shadow may be formed only in a partial region of the inspection area where the bubbles exist. Accordingly, an image of the bubbles flowing in the component may be accurately obtained.

Furthermore, according to the above-described embodiment of the inventive concept, the first surface of the cover 4200 is flat such that light applied by the light source 4420 is incident in the direction perpendicular to the first surface of the cover 4200. Accordingly, even though the component has a curved cross-section perpendicular to the lengthwise direction thereof, refraction of the applied light at the boundary of the component may be minimized. Thus, distortion of a region where bubbles do not exist may be minimized.

According to the embodiments of the inventive concept, bubbles contained in the liquid flowing in the liquid supply unit may be measured.

Furthermore, according to the embodiments of the inventive concept, refraction of incident light at the boundary of a component provided in the liquid supply unit may be minimized.

In addition, according to the embodiments of the inventive concept, a constant bubble image may be obtained irrespective of the cross-sectional shape of the component provided in the liquid supply unit.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
    a liquid supply unit configured to supply a liquid to a substrate;
    a cover formed of a light transmitting material on a component in the liquid supply unit, the cover being configured to provide an inspection area; and
    an inspection unit configured to inspect bubbles contained in the liquid flowing in the component in the inspection area,
    wherein the inspection unit includes:
    a light source configured to apply light toward the inspection area from outside the cover;
    a diffusion plate configured to diffuse the light applied by the light source; and
    a light receiving plate located outside the cover and configured to receive the light passing through the inspection area and to inspect bubbles based on the light,
    wherein the component has a curved cross-section perpendicular to a lengthwise direction thereof,
    wherein a first surface of the cover configured to face the light source is flat, and
    wherein the light source applies the light in a direction perpendicular to the first surface.

2. The apparatus for treating a substrate of claim 1, wherein the cover surrounds the component such that a space is provided between the cover and the component, and
wherein the space is filled with a material having the same refractive index as a material of the component in the inspection area.

3. The apparatus for treating a substrate of claim 2, wherein the cover is formed of a material having a refractive index greater than a refractive index of the material with which the space is filled.

4. The apparatus for treating a substrate of claim 3, wherein the material with which the space is filled is a liquid.

5. The apparatus for treating a substrate of claim 1, wherein a second surface of the cover configured to face the first surface is parallel to the first surface.

6. The apparatus for treating a substrate of claim 5, wherein the diffusion plate is located between the light source and the first surface.

7. The apparatus for treating a substrate of claim 1, wherein the liquid supply unit includes:
a liquid supply nozzle configured to dispense the liquid onto the substrate;
a tank having the liquid stored therein;
a pump configured to provide flow pressure to the liquid supplied to the liquid supply nozzle; and
a liquid supply line through which the liquid is supplied from the tank to the liquid supply nozzle.

8. The apparatus for treating a substrate of claim 7, wherein the cover is on the liquid supply line.

9. The apparatus for treating a substrate of claim 7, wherein the cover is on the tank.

10. The apparatus for treating a substrate of claim 7, wherein the cover is on the liquid supply nozzle.

11. The apparatus for treating a substrate of claim 7, wherein the cover is on the pump.

12. A bubble measurement unit for measuring bubbles contained in a liquid flowing in a component, the bubble measurement unit comprising:
a cover formed of a light transmitting material on the component, the cover being configured to provide an inspection area; and
an inspection unit configured to inspect the bubbles contained in the liquid flowing in the component in the inspection area,
wherein the inspection unit includes:
a light source configured to apply light toward the inspection area from outside the cover;
a diffusion plate configured to diffuse the light applied by the light source; and
a light receiving plate located outside the cover and configured to receive the light passing through the inspection area and to inspect bubbles based on the light,
wherein the component has a curved cross-section perpendicular to a lengthwise direction thereof,
wherein a first surface of the cover configured to face the light source is flat,
wherein a second surface of the cover configured to face the first surface is parallel to the first surface, and
wherein the light source applies the light in a direction perpendicular to the first surface.

13. The bubble measurement unit of claim 12, wherein the cover surrounds the component such that a space is provided between the cover and the component, and
wherein the space is filled with a material having the same refractive index as a material of the component in the inspection area.

14. The bubble measurement unit of claim 13, wherein the cover is formed of a material having a refractive index greater than a refractive index of the material with which the space is filled.

15. An apparatus for treating a substrate, the apparatus comprising:
a liquid supply unit configured to supply a liquid to a substrate;
a cover formed of a light transmitting material on a component in the liquid supply unit, the cover being configured to provide an inspection area; and
an inspection unit configured to inspect bubbles contained in the liquid flowing in the component in the inspection area,
wherein the inspection unit includes:
a light source configured to apply light toward the inspection area from outside the cover; and
a light receiving plate located outside the cover and configured to receive the light passing through the inspection area and to inspect bubbles based on the light,
wherein the component has a curved cross-section perpendicular to a lengthwise direction thereof,
wherein a first surface of the cover configured to face the light source is flat, and
wherein the light source applies the light in a direction perpendicular to the first surface,
wherein a second surface of the cover configured to face the first surface is parallel to the first surface.

16. The apparatus for treating a substrate of claim 15,
wherein the cover surrounds the component such that a space is provided between the cover and the component, and
wherein the space is filled with a material having the same refractive index as a material of the component in the inspection area.

17. The apparatus for treating a substrate of claim 16, wherein the cover is formed of a material having a refractive index greater than a refractive index of the material with which the space is filled.

18. The apparatus for treating a substrate of claim 17, wherein the material with which the space is filled is a liquid.

* * * * *